(12) United States Patent
Kim (10) Patent No.: US 10,998,635 B2
(45) Date of Patent: May 4, 2021

(54) ANTENNA APPARATUS AND VEHICLE

(71) Applicants: Hyundai Motor Company, Seoul (KR); Kia Motors Corporation, Seoul (KR)

(72) Inventor: Dongjin Kim, Whasung-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 309 days.

(21) Appl. No.: 16/174,851

(22) Filed: Oct. 30, 2018

(65) Prior Publication Data

US 2019/0190156 A1  Jun. 20, 2019

(30) Foreign Application Priority Data

Dec. 14, 2017  (KR) .......................... 10-2017-0172091

(51) Int. Cl.

| H01Q 1/32  | (2006.01) |
|---|---|
| H01Q 13/10 | (2006.01) |
| G01S 19/36 | (2010.01) |
| H01Q 1/50  | (2006.01) |
| H05K 1/11  | (2006.01) |
| H01Q 9/04  | (2006.01) |
| H01Q 21/28 | (2006.01) |

(52) U.S. Cl.
CPC .............. *H01Q 13/10* (2013.01); *G01S 19/36* (2013.01); *H01Q 1/32* (2013.01); *H01Q 1/3275* (2013.01); *H01Q 1/50* (2013.01); *H01Q 9/0407* (2013.01); *H01Q 21/28* (2013.01); *H05K 1/115* (2013.01)

(58) Field of Classification Search
CPC ......... H01Q 1/32; H01Q 13/10; H01Q 9/0407
See application file for complete search history.

(56) References Cited

U.S. PATENT DOCUMENTS

| 7,986,279 B2* | 7/2011 | Bruno ................. H01Q 21/064 343/769 |
| 2016/0261039 A1* | 9/2016 | Parsche ............... H01Q 9/0407 |
| 2017/0237171 A1* | 8/2017 | Kim ..................... H01Q 9/0442 343/850 |
| 2020/0227829 A1* | 7/2020 | Jouanlanne ........... H01Q 5/335 |
| 2020/0287287 A1* | 9/2020 | Ying .................... H01Q 9/0414 |

FOREIGN PATENT DOCUMENTS

JP          4315938 B2      8/2009

* cited by examiner

*Primary Examiner* — Hasan Islam
(74) *Attorney, Agent, or Firm* — Morgan, Lewis & Bockius LLP (57) ABSTRACT

A vehicle may include a GPS receiver, a wireless communication apparatus, and the antenna, wherein the antenna may have a first conductive plate in which a slot is formed, a second conductive plate disposed in parallel to the first conductive plate, a dielectric member located between the first conductive plate and the second conductive plate, a plurality of via holes penetrating the first and second conductive plates and the dielectric member, a first feed member configured to transmit a first signal received through the first and the second conductive plates to the GPS receiver, and a second feed member configured to radiate a second signal supplied from the wireless communication apparatus to an inside of a resonance cavity formed by the plurality of via holes.

20 Claims, 10 Drawing Sheets

ANTENNA APPARATUS AND VEHICLE

CROSS-REFERENCE TO RELATED APPLICATION

The present application claims priority to Korean Patent Application No. 10-2017-0172091, filed on Dec. 14, 2017, the entire contents of which is incorporated herein for all purposes by this reference.

BACKGROUND OF THE INVENTION

Field of the Invention

The present invention relates to an antenna apparatus and a vehicle including the same, and more particularly, to an antenna apparatus into which a plurality of antennae are integrated, and a vehicle including the antenna apparatus.

Description of Related Art

A vehicle is means of transportation that runs on a road or a track using fossil fuel or electricity as a power source.

Many vehicles include audio system and video system to allow a driver to listen to the music and watch videos while driving, in addition to transporting goods or persons, and also, include navigation system to display a route to the driver's destination.

Lately, a demand for vehicles capable of communicating with external devices (or other vehicles) is increasing. For example, a navigation function to guide a route to a destination needs to receive Global Positioning System (GPS) signals from GPS satellites in order to determine a position of a vehicle, and to receive traffic information related to roads from a transportation infrastructure in order to seek an optimal route.

Particularly, since a vehicle communicates with an external apparatus (or another vehicle) based on its position, the vehicle requires GPS information essentially for communication.

Meanwhile, a GPS antenna receiving GPS signals is located close to a communication antenna communicating with a transportation infrastructure, and if the GPS antenna is distant from the communication antenna, communication errors may occur due to fading or scattering/disturbance/reflection of electronic waves since vehicle communication is based on position information related to the vehicle.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an antenna apparatus into which a plurality of antennae are integrated, and a vehicle including the antenna apparatus.

Various aspects of the present invention are directed to providing an antenna apparatus into which a Global Positioning System (GPS) antenna and a communication antenna are integrated, and a vehicle including the antenna apparatus.

Additional aspects of the disclosure will be set forth in part in the description which follows and, in part, will be obvious from the description, or may be learned by practice of the disclosure.

In accordance with an aspect of the present invention, an antenna may include a first conductive plate in which a slot is formed, a second conductive plate disposed in parallel to the first conductive plate, a dielectric member located between the first conductive plate and the second conductive plate, a plurality of via holes penetrating the first and second conductive plates and the dielectric member, a first feed member configured to supply a first signal to the first conductive plate, and a second feed member configured to radiate a second signal to an inside of a resonance cavity formed by the plurality of via holes.

The slot may be formed in a center area of the first conductive plate. The plurality of via holes may be formed in a center area of the dielectric member.

The plurality of via holes may be disposed in the shape of a rectangle. The resonance cavity formed by the plurality of via holes may have a shape of a rectangular parallelepiped.

The slot may be formed in an inside of an area defined by the plurality of via holes on the first conductive plate.

The first feed member may be disposed outside the resonance cavity formed by the plurality of via holes.

The second feed member may be disposed in the inside of the resonance cavity formed by the plurality of via holes.

The slot may intersect the radiation member in at least one area.

The first signal may be radiated to free space through the first conductive plate and the second conductive plate. The second signal may be radiated to the free space through the resonance cavity and the slot.

In accordance with an aspect of the present invention, a vehicle may include a GPS receiver, a wireless communication apparatus, and an antenna apparatus. The antenna apparatus may include a first conductive plate in which a slot is formed, a second conductive plate disposed in parallel to the first conductive plate, a dielectric member located between the first conductive plate and the second conductive plate, a plurality of via holes penetrating the first and second conductive plates and the dielectric member, a first feed member configured to transmit a first signal received through the first and the second conductive plates to the GPS receiver, and a second feed member configured to radiate a second signal supplied from the wireless communication apparatus to an inside of a resonance cavity formed by the plurality of via holes.

The slot may be formed in a center area of the first conductive plate, and the plurality of via holes are formed in a center area of the dielectric member.

The plurality of via holes may be disposed in the shape of a rectangle. The resonance cavity formed by the plurality of via holes may have a shape of a rectangular parallelepiped.

The slot may be formed in an inside of an area defined by the plurality of via holes on the first conductive plate.

The first feed member may be disposed outside the resonance cavity formed by the plurality of via holes.

The second feed member may be disposed in the inside of the resonance cavity formed by the plurality of via holes.

The slot may intersect the radiation member in at least one area.

The first signal may be received form free space through the first conductive plate and the second conductive plate. The second signal may be radiated to the free space through the resonance cavity and the slot.

The GPS receiver may be connected to a first antenna the antenna apparatus. The first antenna may include the first conductive plate, the second conductive plate, the dielectric member, and the first feed member.

The wireless communication apparatus may be connected to a second antenna of the antenna apparatus. The second antenna may include the resonance cavity formed by the plurality of via holes, the slot formed in the first conductive plate, and the second feed member.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments of the present invention, it will be understood that the present description is not intended to limit the invention(s) to those exemplary embodiments. On the other hand, the invention(s) is/are intended to cover not only the exemplary embodiments of the present invention, but also various alternatives, modifications, equivalents and other embodiments, which may be included within the spirit and scope of the invention as defined by the appended claims.

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing operations described is an example; however, the sequence of and/or operations is not limited to that set forth herein and may be changed as is known in the art, with the exception of operations necessarily occurring in a particular order. Furthermore, respective descriptions of well-known functions and constructions may be omitted for increased clarity and conciseness.

Additionally, various exemplary embodiments will now be described more fully hereinafter with reference to the accompanying drawings. The exemplary embodiments may, however, be embodied in various forms and should not be construed as being limited to the exemplary embodiments set forth herein. These embodiments are provided so that the present disclosure will be thorough and complete and will fully convey the exemplary embodiments to those of ordinary skill in the art. Like numerals denote like elements throughout.

It will be understood that, although the terms first, second, etc. may be used herein to describe various elements, these elements should not be limited by these terms. These terms are only used to distinguish one element from another. As used herein, the term "and/or," includes any and all combinations of one or more of the associated listed items.

It will be understood that when an element is referred to as being "connected," or "coupled," to another element, it may be directly connected or coupled to the other element or intervening elements may be present. In contrast, when an element is referred to as being "directly connected," or "directly coupled," to another element, there are no intervening elements present.

The terminology used herein is for the purpose of describing various exemplary embodiments only and is not intended to be limiting. As used herein, the singular forms "a," "an," and "the," are intended to include the plural forms as well, unless the context clearly indicates otherwise.

Reference will now be made in detail to the exemplary embodiments of the present invention, examples of which are illustrated in the accompanying drawings, wherein like reference numerals refer to like elements throughout.

The expression, "at least one of a, b, and c," should be understood as including only a, only b, only c, both a and b, both a and c, both b and c, or all of a, b, and c.

Hereinafter, the operation principle and embodiments of the present invention will be described with reference to the accompanying drawings.

Figure 1:
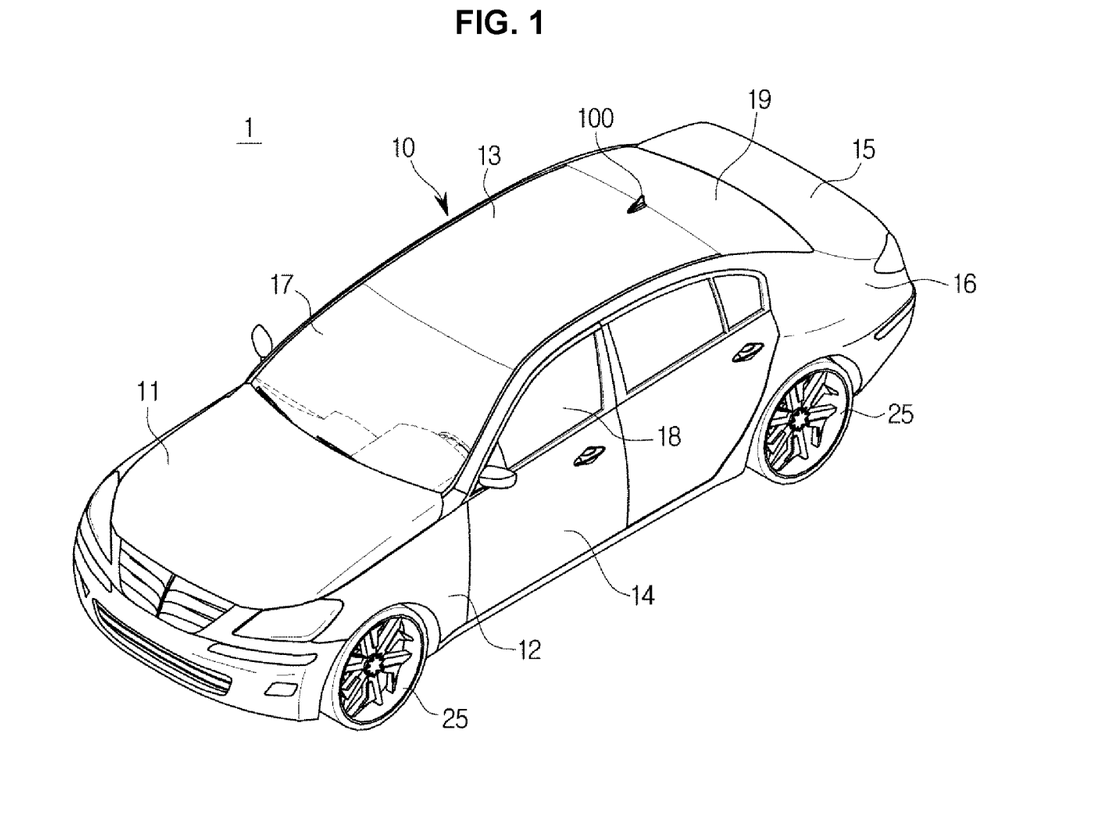
FIG. 1 shows a vehicle body according to an exemplary embodiment of the present invention.
Figure 2:
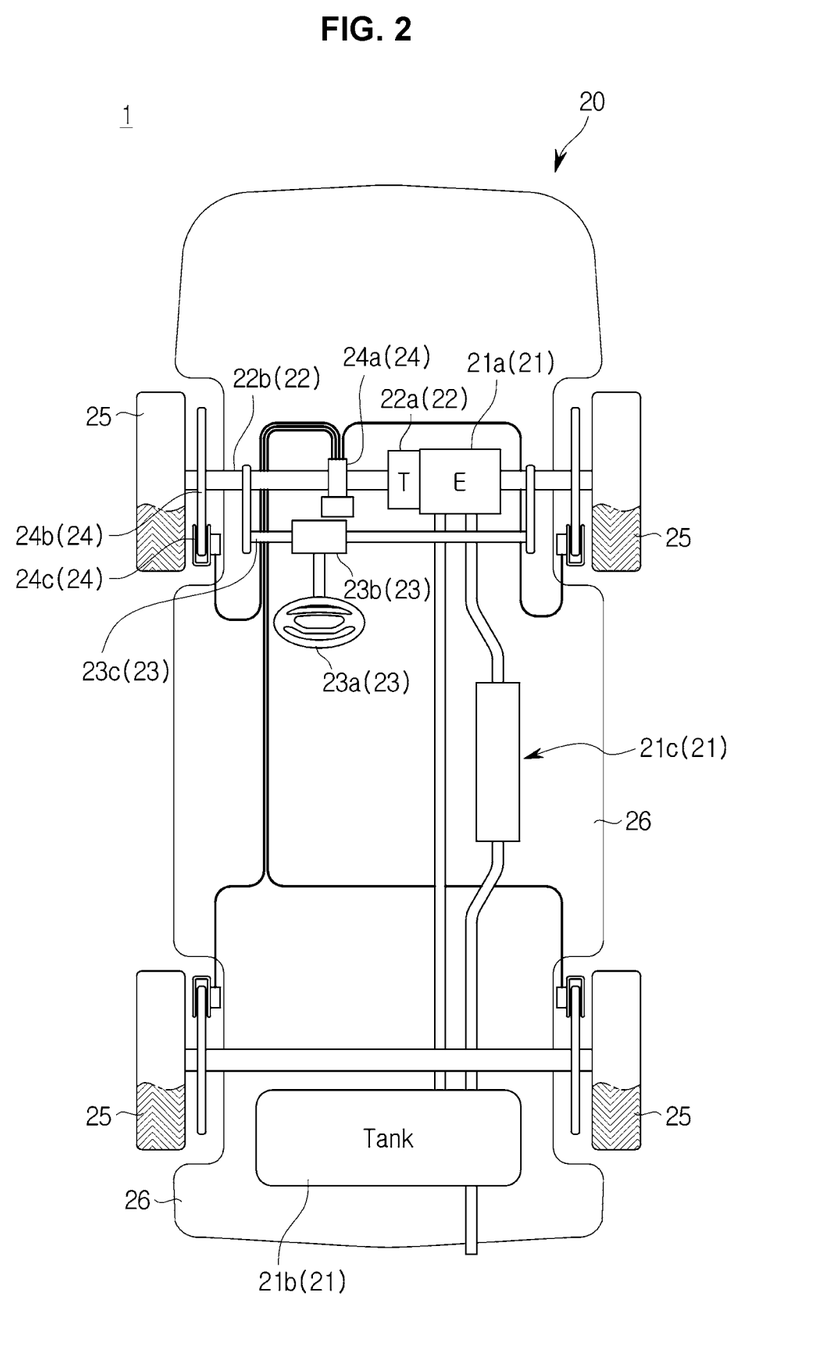
FIG. 2 shows a chassis of a vehicle according to an exemplary embodiment of the present invention.
Figure 3:
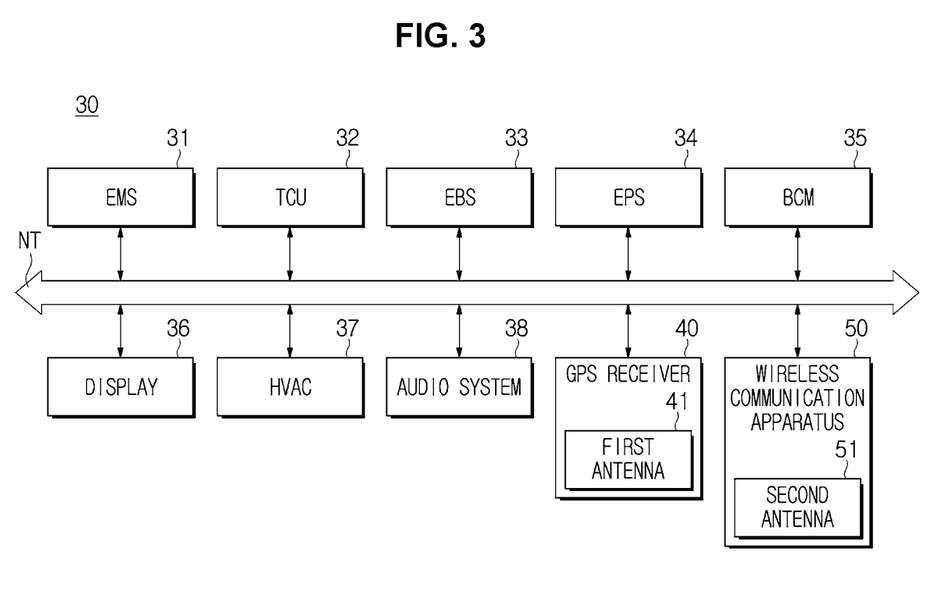
FIG. 3 shows electric components of a vehicle according to an exemplary embodiment of the present invention.

FIG. 1 shows a vehicle body according to an exemplary embodiment of the present invention. FIG. 2 shows a chassis of a vehicle according to an exemplary embodiment of the present invention. FIG. 3 shows electric components of a vehicle according to an exemplary embodiment of the present invention.

Referring to FIGS. 1, 2, and 3, a vehicle 1 may include a body 10 forming an external appearance of the vehicle 1 and accommodating a driver and/or goods, a chassis 20 including components of the vehicle 1 except for the body 10, and a plurality of electric components 30 for protecting a driver and providing the driver with convenience.

As shown in FIG. 1, the body 10 may form inside space where the driver stays, an engine compartment for accommodating an engine therein, and a trunk compartment for accommodating goods therein.

The body 10 may include a hood 11, front fenders 12, a roof panel 13, a plurality of doors 14, a trunk lid 15, and quarter panels 16. Also, to secure the driver's view, a front window 17 may be disposed in a front portion of the body 10, side windows 18 may be disposed in both sides of the body 10, and a rear window 19 may be disposed in a rear portion of the body 10.

As shown in FIG. 2, the chassis 20 may include a power generating apparatus 21, a power transferring apparatus 22, a steering apparatus 23, a brake apparatus 24, a plurality of wheels 25, a frame 26, etc. to enable the vehicle 1 to travel according to the driver's control.

The power generating apparatus 21 may generate a rotational force for driving the vehicle 1 according to the driver's acceleration control, and include an engine 21a, a fuel supply apparatus 21b, an exhaust apparatus 21c, an accelerator pedal, etc.

The power transferring apparatus 22 may transfer a rotational force generated by the power generating apparatus 21 to the wheels 25, and include a clutch/transmission 22a, a driveshaft 22b, a gearshift, etc.

The steering apparatus 23 may change a driving direction of the vehicle 1 according to the driver's steering control, and include a steering wheel 23a, a steering gear 23b, a steering link 23c, etc.

The brake apparatus 24 may stop the vehicle 1 according to the driver's brake control, and include a master cylinder 24a, a brake disc 24b, a brake pad 24c, a brake pedal, etc.

The wheels 25 may receive a rotational force from the power generating apparatus 21 through the power transferring apparatus 22 to move the vehicle 1. The wheels 25 may include front wheels provided in the front portion of the vehicle 1, and rear wheels provided in the rear portion of the vehicle. 1.

The frame 26 may fix the power generating apparatus 21, the power transferring apparatus 22, the steering apparatus 23, the brake apparatus 24, and the wheels 25.

The vehicle 1 may include various electric components 30 for controlling the vehicle 1 and providing the driver and passengers with convenience and safety, in addition to the above-described mechanical components.

As shown in FIG. 3, the vehicle 1 may include Engine Management System (EMS) 31, a Transmission Control Unit (TCU) 32, Electronic Braking System (EBS) 33, Electric Power Steering (EPS) 34, a Body Control Module (BCM) 35, a display 36, Heating/Ventilation/Air Conditioning (HVAC) system 37, audio system 38, a GPS receiver 40, and a wireless communication apparatus 50.

The EMS 31 may control the operation of the engine and manage the engine, in a response to the driver's acceleration command received through the accelerator pedal. For example, the EMS 31 may perform engine torque control, fuel efficiency control, engine failure diagnosis, and/or generator control.

The TCU 32 may control the operation of the transmission in a response to the driver's gear-shifting command received through a gearshift 22c or in a response to the driving speed of the vehicle 1. For example, the TCU 32 may perform clutch control, transmission control, and/or engine torque control during gear-shifting.

The EBS 33 may control brake system of the vehicle 1 and maintain the balance of the vehicle 1, in a response to the driver's brake command received through the brake pedal. For example, the EBS 33 may perform automatic parking braking, slip prevention during braking, and/or slip prevention during steering.

The EPS 34 may assist the driver to easily manipulate the steering wheel 34a. For example, the EPS 34 may assist the driver's steering manipulation by decreasing steering torque upon low-speed driving or parking and increasing steering torque upon high-speed driving.

The BCM 35 may control the operation of electric components for providing the driver with convenience or for security. For example, the BCM 35 may control a door lock apparatus, a head lamp, wipers, a power seat, a seat heater, a cluster, an interior lamp, navigation system, a multi-functional switch, etc. disposed in the vehicle 1.

The display 36 may be disposed in a center fascia within the vehicle 1 to provide the driver with various information and entertainment through a screen. For example, the display 36 may reproduce a video file stored in internal storage medium or external storage medium according to the driver's command, and output images included in the video file. Also, the display 36 may receive information related to a destination from the driver through the driver's touch input, and display a route to the destination.

The HVAC system 37 may heat or cool indoor air according to indoor temperature of the vehicle 1 and target temperature input by the driver. For example, if the indoor temperature is higher than the target temperature, the HVAC system 37 may cool indoor air, and if the indoor temperature is lower than the target temperature, the HVAC system 37 may heat the indoor air. Also, the HVAC system 37 may cause outside air of the vehicle 1 to flow to the inside of the vehicle 1, or prevent outside air of the vehicle 1 from flowing to the inside of the vehicle 1, according to an external environment of the vehicle 1, and circulate indoor air of the vehicle 1.

The audio system 38 may provide the driver with various information and entertainment through sound. For example, the audio system 38 may reproduce an audio file stored in the internal storage medium or the external storage medium according to the driver's command, and output sound included in the audio file. Also, the audio system 38 may receive an audio broadcasting signal, and output sound corresponding to the received audio broadcasting signal.

The GPS receiver 40 may receive a GPS signal including information related to time of signaling from a plurality of GPS satellites and about positions of the GPS satellites from the GPS satellites, and then determine its position based on the information related to the time of signaling from the GPS satellites and about the positions of the GPS satellites. The GPS receiver 40 may determines distances to the GPS satellites based on differences between the time of signaling and time of arrival of GPS signals, and determine its position based on the distances to the GPS satellites and the positions of the GPS satellites.

The GPS receiver 40 may include a first antenna 41 for receiving GPS signals. Also, the GPS receiver 40 may receive GPS wireless signals having a frequency of, for example, about 1.575 GHz.

The wireless communication apparatus 50 may communicate with other vehicles, user terminals, or communication relays, etc. in a wireless fashion. The wireless communication apparatus 50 may be used for Vehicle to Vehicle (V2V) communication, Vehicle to Infrastructure (V2I) communication, Vehicle to Nomadic devices (V2N) communication, Vehicle to Grid (V2G) communication, etc.

The wireless communication apparatus 50 may transmit and receive signals through various communication standards. For example, the wireless communication apparatus 50 may adopt a 2nd-Generation (2G) communication method (for example, Time Division Multiple Access (TDMA) and Code Division Multiple Access (CDMA)), a 3rd-Generation (3G) communication method (for example, Wide Code Division Multiple Access (WCDMA), Code Division Multiple Access 2000 (CDMA2000), Wireless Broadband (Wibro), and World Interoperability for Microwave Access (WiMAX)), or a 4th-Generation (4G) communication method (for example, Long Term Evolution (LTE) and Wireless Broadband Evolution). Also, the wireless communication apparatus 50 may adopt a 5th-Generation (5G) communication method.

The wireless communication apparatus 50 may include a second antenna 51 for transmitting/receiving wireless signals to/from other vehicles, user terminals, communication relays, etc. Also, the wireless communication apparatus 50 may transmit and receive wireless communication signals having a frequency of, for example, about 5.9 GHz.

Also, the vehicle 1 may further include electric components 30 for protecting the driver and provide the driver with convenience. For example, the vehicle 1 may include the electric components 30, such as a door lock apparatus, wipers, a power seat, a seat heater, a cluster, an interior lamp, a navigation system, and a multi-functional switch.

The electric components 30 may communicate with each other through a communication network (NT) for vehicle. For example, the electric components 30 may transmit and receive data through the Ethernet, Media Oriented Systems Transport (MOST), Flexray, Controller Area Network (CAN), Local Interconnect Network (LIN), etc.

As described above, the vehicle 1 may include the first antenna 41 for receiving GPS signals, and the second antenna 51 for communicating with an external apparatus/ another vehicle. For example, the vehicle 1 may include an antenna apparatus 100 into which the first antenna 41 and the second antenna 51 are integrated, as shown in FIG. 1.

Hereinafter, the antenna apparatus 100 into which the first antenna 41 and the second antenna 51 are integrated will be described.

Figure 4:
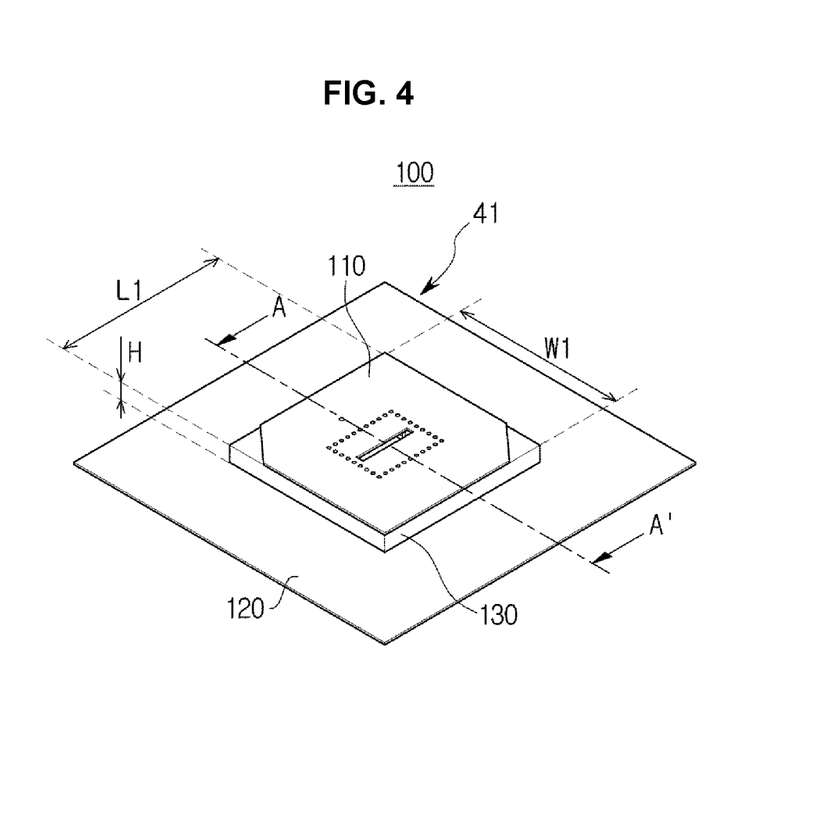
FIG. 4 shows an external appearance of an antenna apparatus according to an exemplary embodiment of the present invention.
Figure 5:
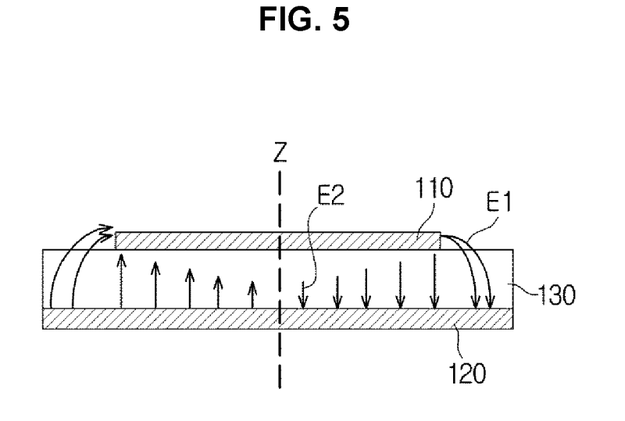
FIG. 5 shows an electric field formed by a patch antenna.
Figure 6:
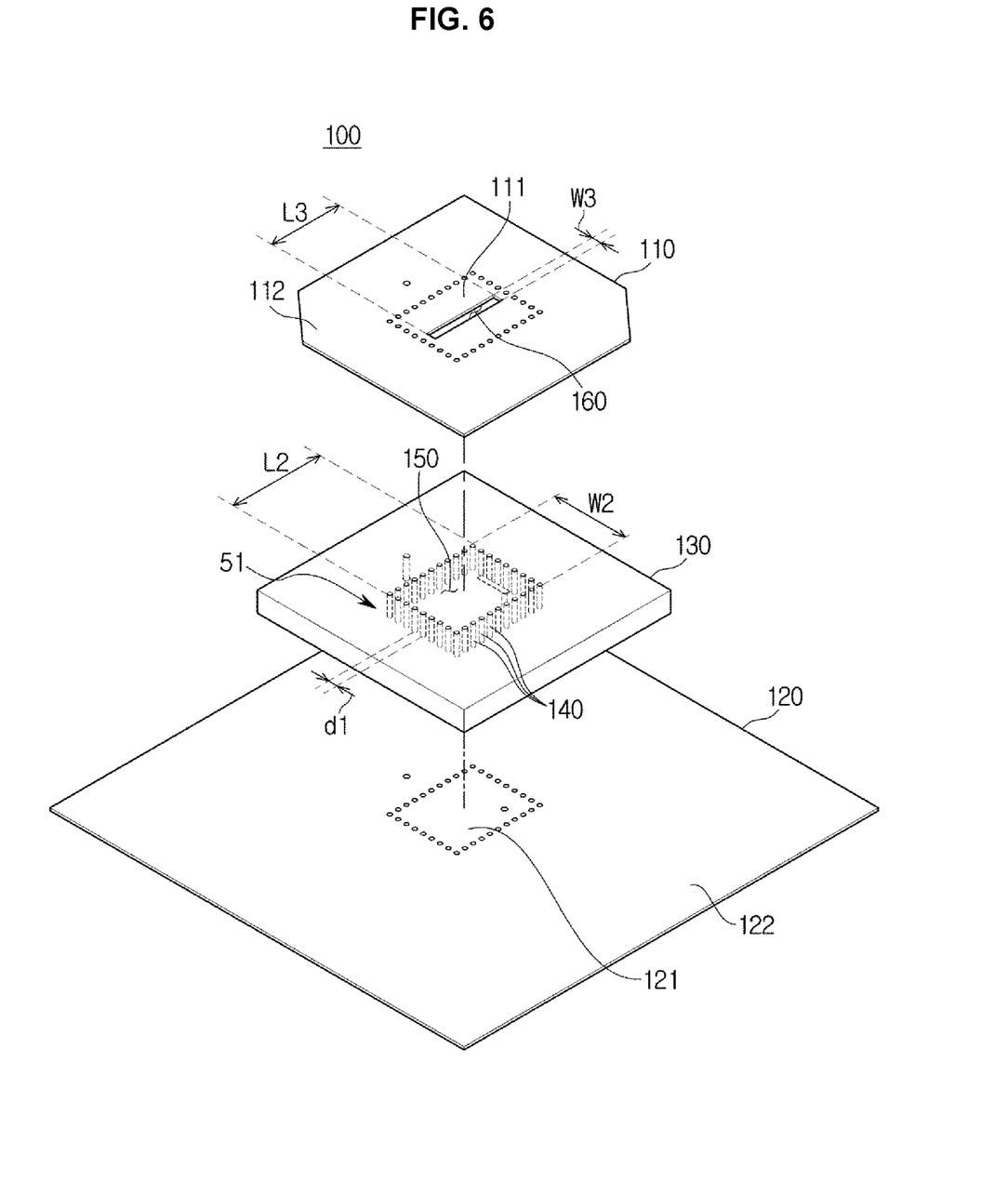
FIG. 6 is an exploded perspective view of an antenna apparatus according to an exemplary embodiment of the present invention.
Figure 7:
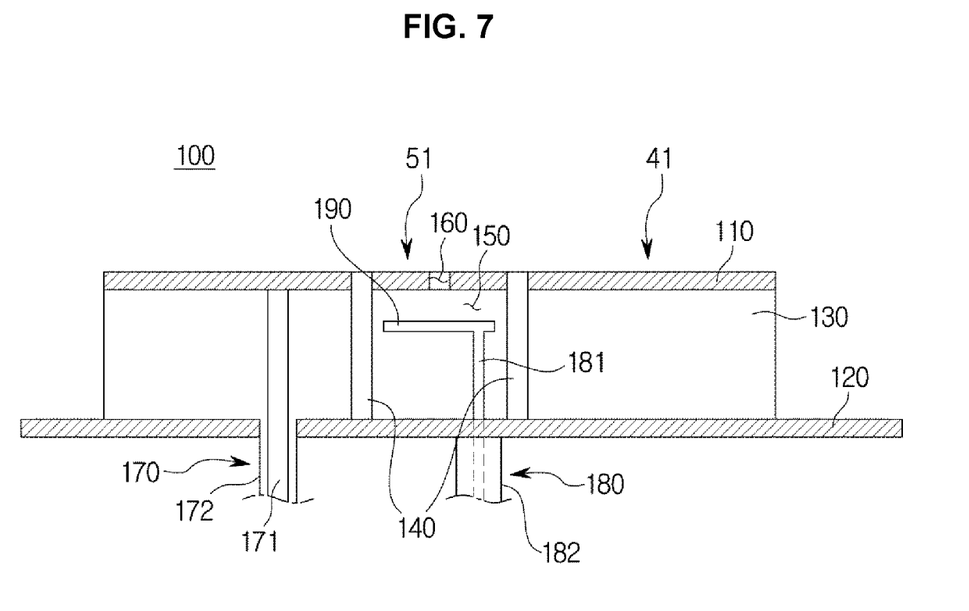
FIG. 7 is a cross-sectional view of the antenna apparatus taken along line A-A' of FIG. 4.

FIG. 4 shows an external appearance of an antenna apparatus according to an exemplary embodiment of the present invention. FIG. 5 shows an electric field formed by a patch antenna. FIG. 6 is an exploded perspective view of an antenna apparatus according to an exemplary embodiment of the present invention. FIG. 7 is a cross-sectional view of the antenna apparatus taken along line A-A' of FIG. 4.

Hereinafter, a structure of the antenna apparatus 100 will be described with reference to FIGS. 4, 5, 6, and 7.

As shown in FIG. 4, the antenna apparatus 100 may include an upper conductive plate 110, a lower conductive plate 120, and a dielectric member 130.

The upper conductive plate 110 may face the lower conductive plate 120, and the dielectric member 130 may be located between the upper conductive plate 110 and the lower conductive plate 120.

The upper conductive plate 110 may include a conductive material such as a metal transmitting electricity.

The upper conductive plate 110 may be in the shape of a rectangle, and a pair of vertices positioned diagonally in the rectangle may be cut to form a hexagonal shape.

A length L1 and a width W1 of the upper conductive plate 110 may depend on a frequency of a wireless signal to be transmitted and a dielectric constant of the dielectric member 130.

The lower conductive plate 120 may also include a conductive material such as a metal transmitting electricity.

The lower conductive plate 120 may be in the shape of a rectangle of the same size as the upper conductive plate 110, or in the shape of a wider rectangle than the upper conductive plate 110. The lower conductive plate 120 may provide an electrical ground.

The dielectric member 130 may include a dielectric material that does not transmit electricity. The dielectric member 130 may have polarity in an electric field. When positive charges and negative charges in the dielectric member 130 are aligned by an electric field, the dielectric member 130 may have polarity.

The dielectric member 130 may be disposed between the upper conductive plate 110 and the lower conductive plate 120, and may be in the shape of a rectangular parallelepiped. Also, a length and a width of the dielectric member 130 may be respectively identical to the length L1 and width W1 of the upper conductive plate 110.

The upper conductive plate 110, the lower conductive plate 120, and the dielectric member 130 may be integrated to form the first antenna 41 for receiving GPS signals. The first antenna 41 may be a patch antenna. The patch antenna may be a kind of microstrip antenna. The patch antenna may be configured with a flat sheet or patch provided on a ground plate being a wide flat plate.

The second antenna 51 may be formed in the inside of the first antenna 41.

An electric field formed in the inside of the patch antenna may have a highest intensity at an edge area of the patch antenna, and a lowest intensity at a center area of the patch antenna.

For example, if a signal is provided to the first antenna 41, electric fields E1 and E2 may be formed in the dielectric member 130 between the upper conductive plate 110 and the lower conductive plate 120, as shown in FIG. 5.

Comparing the first electric field E1 formed at the edge area of the dielectric member 130 to the second electric field E2 formed at the center area of the dielectric member 130, it is seen that the intensity of the first electric field E1 is higher than that of the second electric field E2.

Particularly, as shown in FIG. 5, the intensities of the electric fields E1 and E2 may be reduced gradually toward the center area of the dielectric member 130 from the edge area of the dielectric member 130, and at the center of the dielectric member 130, that is, at the center of the upper conductive plate 110, the electric field E2 may have a lowest intensity.

The area at which the intensity of the electric field E1 is lowest may actually have little influence on operation of the first antenna 41. Accordingly, removing the center area of the dielectric member 130, that is, the center area of the upper conductive plate 110 may have little influence on the performance of the first antenna 41.

For the present reason, the second antenna 51 may be disposed at the center area of the dielectric member 130.

As shown in FIG. 6 and FIG. 7, a plurality of conductive via holes 140 may be formed at the center area of the dielectric member 130. In the inside of the plurality of conductive via holes 140, a resonance cavity 150 may be formed to resonate wireless communication signals.

The plurality of conductive via holes 140 may include a conductive material such as a metal transmitting electricity. The conductive via holes 140 may penetrate the dielectric member 130 from the lower conductive plate 120 to be formed up to the upper conductive plate 110. Also, the plurality of conductive via holes 140 may be disposed in the shape of a rectangle.

The plurality of conductive via holes 140, the upper conductive plate 110, and the lower conductive plate 120 may form the resonance cavity 150 in the shape of a rectangular parallelepiped at the center area of the dielectric member 130. In the inside of the resonance cavity 150, a wireless communication signal transmitted and received by the second antenna 51 may resonate.

The plurality of conductive via holes 140 may block a GPS signal received by the first antenna 41 from entering the inside of the resonance cavity 150. Also, the plurality of conductive via holes 140 may block a wireless communication signal transmitted or received by the second antenna 51 from leaking out of the resonance cavity 150.

The plurality of conductive via holes 140 may be disposed at a distance dl depending on the wavelength of the GPS signal or the wavelength of the wireless communication signal to block the GPS signal and the wireless communication signal. For example, if a GPS signal has a frequency of about 1.575 GHz and a wireless communication signal has a frequency of about 5.9 GHz, the plurality of conductive via holes 140 may be disposed at a distance of about 0.1 times of the wavelength of the wireless communication signal since the wavelength of the wireless communication signal is shorter than that of the GPS signal.

Since GPS signals and wireless communication signals are blocked by the plurality of conductive via holes 140, wireless communication signals transmitted and received by the second antenna 51 may not interfere with GPS signals received by the first antenna 41. In other words, in view of wireless signals, the inside of the resonance cavity 150 may be isolated from the outside of the resonance cavity 150 by the plurality of conductive via holes 140. That is, the plurality of conductive via holes 140 may function as a partition wall for isolating the inside of the resonance cavity 150 from the outside of the resonance cavity 150.

A length L2 and a width W2 of the resonance cavity 150 may depend on a frequency of a wireless signal to be transmitted and the dielectric constant of the dielectric member 130.

The upper conductive plate 110 may be partitioned to a first antenna upper area 111 corresponding to the inside of the rectangle defined by the plurality of conductive via holes 140, and a second antenna upper area 112 corresponding to the outside of the rectangle defined by the plurality of conductive via holes 140.

In the center area of the upper conductive plate 110, a slot 160 for radiating wireless communication signals from the second antenna 51 to free space may be formed.

The slot 160 may be formed in the first antenna upper area 111, and extend in the longitudinal direction of the upper conductive plate 110. A length L3 and a width W3 of the slot 160 may depend on a frequency of a wireless signal to be transmitted, and the dielectric constant of the dielectric member 130.

The lower conductive plate 120 may be partitioned to a first antenna lower area 121 corresponding to the inside of the rectangle defined by the plurality of conductive via holes 140, and a second antenna lower area 122 corresponding to the outside of the rectangle defined by the plurality of conductive via holes 140.

Accordingly, the second antenna 51 may be formed by the second antenna upper area 112 of the upper conductive plate 110, the second antenna lower area 122 of the lower conductive plate 120, and the plurality of conductive via holes 140.

A wireless communication signal may resonate in the inside of the resonance cavity 150 formed by the second antenna upper area 112, the second antenna lower area 122, and the plurality of conductive via holes 140. Also, a wireless communication signal may radiate from the inside of the resonance cavity 150 to the free space through the slot 160 formed in the upper conductive plate 110, or a wireless communication signal may enter the inside of the resonance cavity 150 from the free space through the slot 160.

The first antenna lower area 121 of the lower conductive plate 120 may be connected to a first feed cable 170 for transmitting signals to the first antenna 41.

The first feed cable 170 may be a coaxial cable. The first feed cable 170 may include a first internal conductor 171 disposed in the center of the cable, and a second external conductor 172 surrounding the first internal conductor 171 in the outside of the first internal conductor 171.

The first internal conductor 171 may transmit signals, and penetrate the dielectric member 130 to be connected to the first antenna upper area 111 of the upper conductive plate 110. Also, the first external conductor 172 may form a ground, and be connected to the first antenna lower area 121 of the lower conductive plate 120.

The first feed cable 170 may be disposed at the center of the upper conductive plate 110 in the longitudinal direction of the upper conductive plate 110, and at a location deviated in a direction from the center of the upper conductive plate 110 in the width direction of the upper conductive plate 110.

A GPS signal may be received by the first antenna 41 formed by the upper conductive plate 110 and the lower conductive plate 120.

The second antenna lower area 122 of the lower conductive plate 120 may be connected to a second feed cable 180 to transmit signals to the second antenna 51.

The second feed cable 180 may be a coaxial cable. The second feed cable 180 may include a first internal conductor 181 disposed at the center of the cable, and a second external conductor 182 surrounding the second internal conductor 181 in the outside of the second internal conductor 181.

The second internal conductor 181 may transmit signals, and penetrate the dielectric member 130 to be connected to a radiation member 190 disposed in the resonance cavity 150 of the dielectric member 130.

The radiation member 190 may be disposed in the inside of the resonance cavity 150, and extend in the width direction of the resonance cavity 150. Accordingly, the radiation member 190 may intersect the slot 160 extending in the longitudinal direction of the upper conductive plate 110.

Accordingly, the radiation member 190 may be disposed at a location deviating from the center of the resonance cavity 150 in the longitudinal direction of the resonance cavity 150.

A signal transmitted by the second feed cable 180 may radiate to the inside of the resonance cavity 150 by the radiation member 190, and a wireless signal entered the inside of the resonance cavity 150 through the slot 160 of the upper conductive plate 110 may be received by the radiation member 190.

The second external conductor 182 may form a ground, and be connected to the second antenna lower area 122 of the lower conductive plate 120.

Wireless communication signals may be transmitted and received by the second antenna 51 formed by the slot 160 of the first upper conductive plate 110 and the resonance cavity 150.

The first antenna 41 and the second antenna 51 may transmit and receive polarized waves perpendicular to each other.

Figure 8:
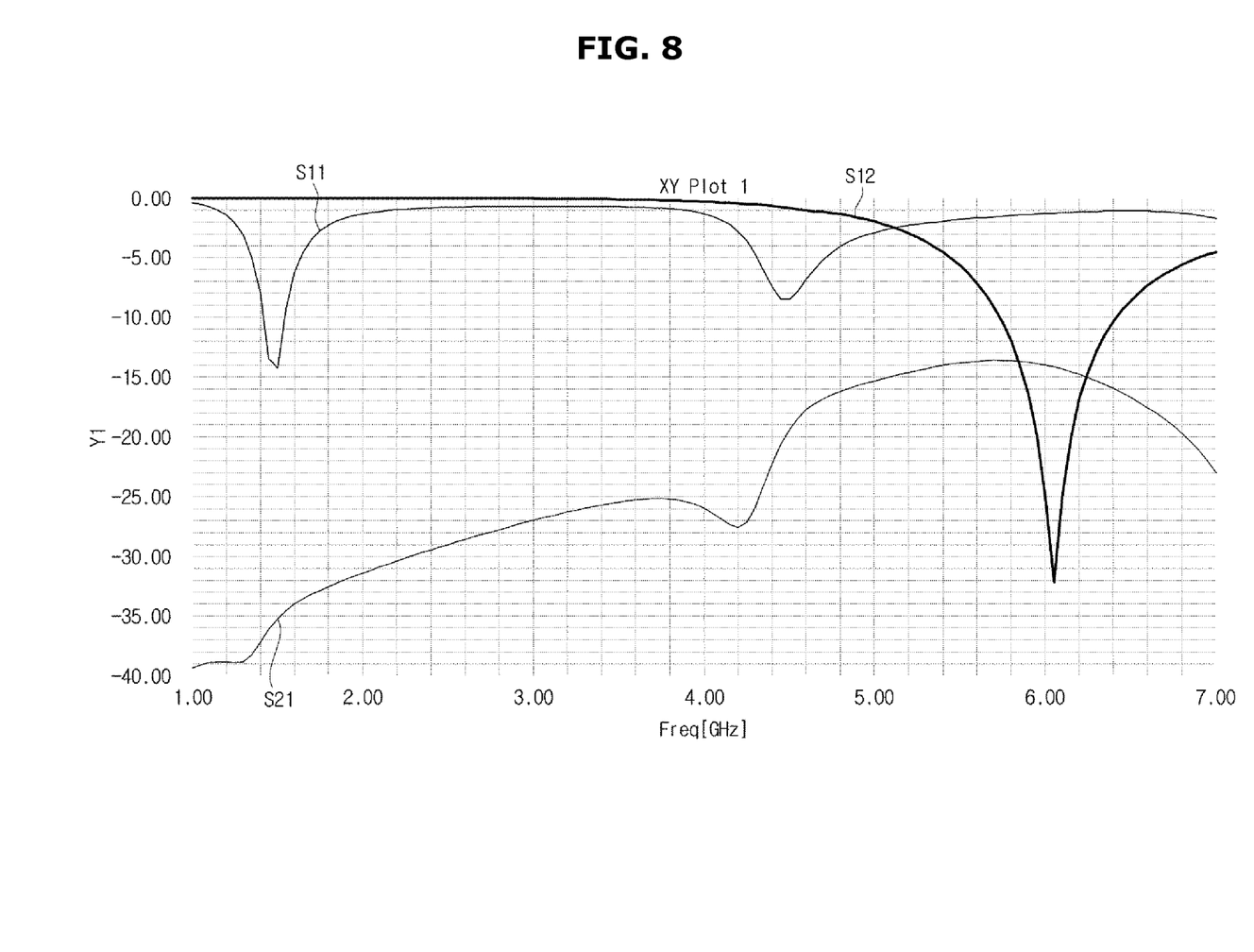
FIG. 8 shows a frequency characteristic of an antenna apparatus according to an exemplary embodiment of the present invention.

FIG. 8 shows a frequency characteristic of an antenna apparatus according to an exemplary embodiment of the present invention. FIG. 8 shows reflectivity S11 of the first antenna 41, reflectivity S22 of the second antenna 51, and transmittance S21 from the first antenna 41 to the second antenna 51.

The reflectivity S11 of the first antenna 41 may represent a ratio of power of a signal reflected from the first antenna 41 with respect to power of a signal supplied to the first antenna 41 through the first feed cable 170. Also, the reflectivity S22 of the second antenna 51 may represent a ratio of power of a signal reflected from the second antenna 51 with respect to power of a signal supplied to the second antenna 51 through the second feed cable 180. Low reflectivity of an antenna means that signals are radiated to free space through the antenna.

As shown in FIG. 8, the first antenna 41 may have reflectivity S11 which is lower than about −10 dB at a frequency of about 1.575 GHz. Meanwhile, the first antenna 41 may have reflectivity S11 which is higher than −10 dB at the other frequencies. That is, the first antenna 41 can selectively radiate a wireless signal of a frequency of about 1.575 GHz to free space by the reflectivity S11 of the first antenna 41.

Also, the second antenna 51 may have reflectivity S22 which is lower than about −30 dB at a frequency of about 5.9 GHz. Meanwhile, the second antenna 51 may have reflectivity S22 which is higher than −10 dB at the other frequencies. That is, the second antenna 51 can selectively radiate a wireless signal of a frequency of about 5.9 GHz to free space by the reflectivity S22 of the second antenna 51.

The transmittance S21 from the first antenna 21 to the second antenna 51 may represent a ratio of power of a signal output from the second antenna 51 with respect to power of a signal supplied to the first antenna 41. Interference occurring between the first antenna 41 and the second antenna 51 may be represented by the transmittance S21.

As shown in FIG. 8, the first antenna 41 and the second antenna 51 may have transmittance S21 which is lower than about −10 dB at all frequencies. Accordingly, it is seen that interference between the first antenna 41 and the second antenna 51 is very small. In other words, the first antenna 41 is electrically isolated from the second antenna 51 by the plurality of conductive via holes 140.

Accordingly, the antenna apparatus 100 may selectively transmit and receive a GPS signal and a wireless communication signal, while reducing interference between the GPS signal and the wireless communication signal.

Figure 9:
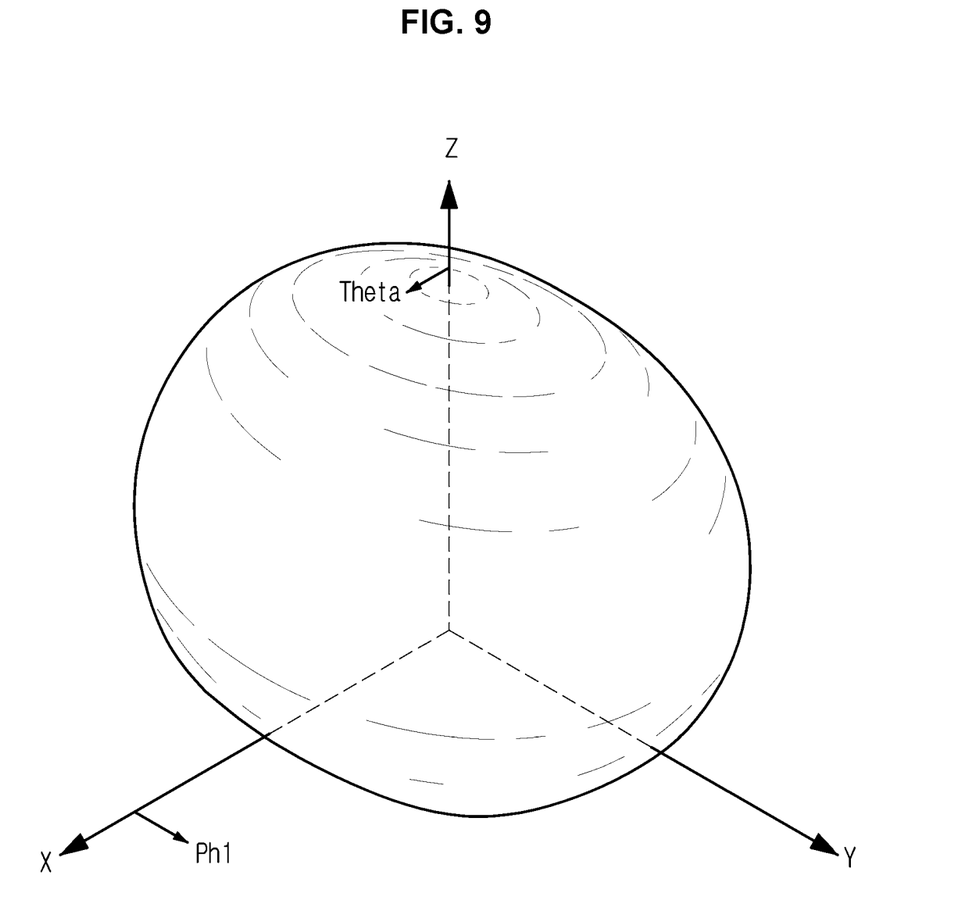
FIG. 9 shows a radiation characteristic of a first antenna included in an antenna apparatus according to an exemplary embodiment of the present invention.
Figure 10:
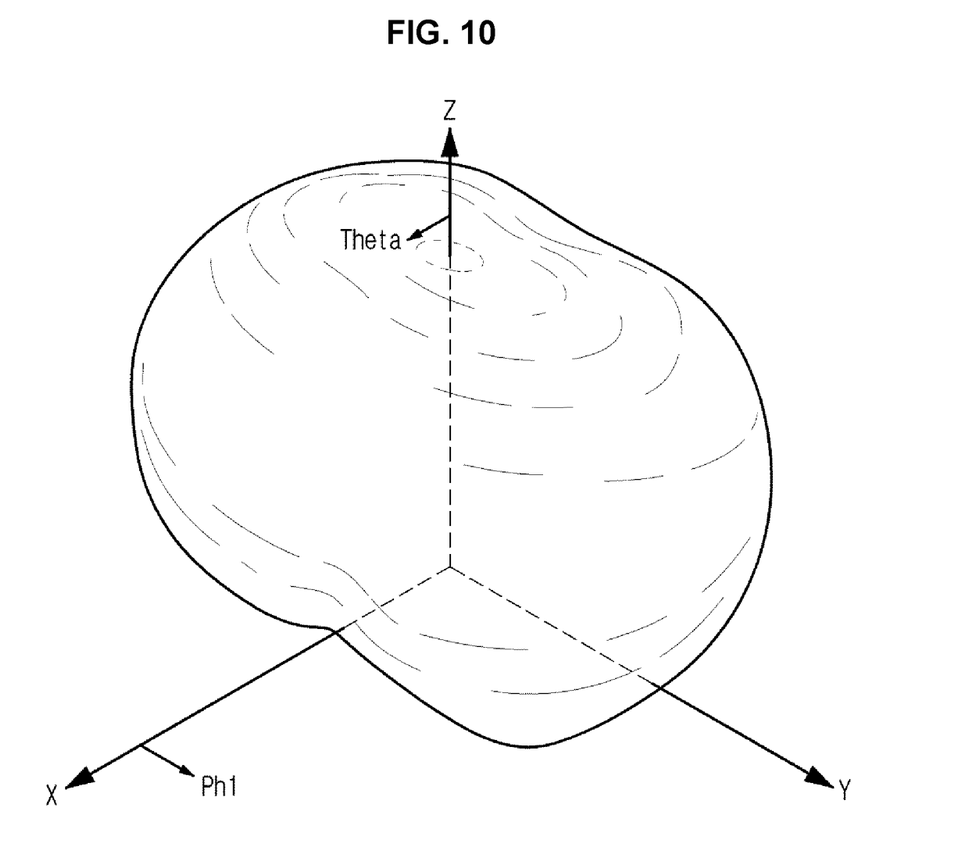
FIG. 10 shows a radiation characteristic of a second antenna included in an antenna apparatus according to an exemplary embodiment of the present invention.

FIG. 9 shows a radiation characteristic of a first antenna included in an antenna apparatus according to an exemplary embodiment of the present invention. FIG. 10 shows a radiation characteristic of a second antenna included in an antenna apparatus according to an exemplary embodiment of the present invention.

As shown in FIG. 9, the first antenna 41 may show a typical radiation characteristic of a patch antenna. The first antenna 41 may radiate a wireless signal upwards from the upper conductive plate 110.

As shown in FIG. 10, the second antenna 51 may show a radiation characteristic extending in a width direction of the antenna apparatus 100 rather than in a longitudinal direction of the antenna apparatus 100.

Also, the radiation characteristic of the first antenna 41 may nearly overlap with the radiation characteristic of the second antenna 51.

According to an aspect of the present invention, an antenna apparatus into which a plurality of antennae is integrated, and a vehicle including the antenna apparatus may be provided.

According to another aspect of the present invention, an antenna apparatus into which a GPS antenna and a communication antenna are integrated, and a vehicle including the antenna apparatus may be provided.

According to another aspect of the present invention, since the communication antenna and the GPS antenna are disposed at the same location, it is possible to synchronize communication with an external device with reception of a GPS signal.

According to another aspect of the present invention, since the communication antenna and the GPS antenna are integrated into one body, the size of the antenna apparatus may be reduced.

According to another aspect of the present invention, the communication antenna may be isolated from the GPS antenna although the communication antenna and the GPS antenna are integrated into one body.

Although a few embodiments of the present invention have been shown and described, it would be appreciated by those skilled in the art that changes may be made in these embodiments without departing from the principles and spirit of the disclosure, the scope of which is defined in the claims and their equivalents.

Exemplary embodiments of the present invention have been described above. In the exemplary embodiments described above, some components may be implemented as a "module". Here, the term 'module' means, but is not limited to, a software and/or hardware component, such as a Field Programmable Gate Array (FPGA) or Application Specific Integrated Circuit (ASIC), which performs certain tasks. A module may advantageously be configured to reside on the addressable storage medium and configured to execute on one or more processors.

Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The operations provided for in the components and modules may be combined into fewer components and modules or further separated into additional components and modules. Furthermore, the components and modules may be implemented such that they execute one or more CPUs in a device.

With that being said, and in addition to the above described exemplary embodiments of the present invention, embodiments can thus be implemented through computer readable code/instructions in/on a medium, e.g., a computer readable medium, to control at least one processing element to implement any above described exemplary embodiment of the present invention. The medium can correspond to any medium/media permitting the storing and/or transmission of the computer readable code.

The computer-readable code may be recorded on a medium or transmitted through the Internet. The medium may include Read Only Memory (ROM), Random Access Memory (RAM), Compact Disk-Read Only Memories (CD- ROMs), magnetic tapes, floppy disks, and optical recording medium. Also, the medium may be a non-transitory computer-readable medium. The media may also be a distributed network, so that the computer readable code is stored or transferred and executed in a distributed fashion. Still Furthermore, as only an example, the processing element may include at least one processor or at least one computer processor, and processing elements may be distributed and/or included in a single device.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An antenna apparatus comprising:
a first conductive plate in which a slot is formed;
a second conductive plate disposed in parallel to the first conductive plate;
a dielectric member located between the first conductive plate and the second conductive plate;
a plurality of via holes penetrating the first and second conductive plates and the dielectric member;
a first feed member configured to supply a first signal to a global positioning system receiver of a vehicle through the first conductive plate; and
a second feed member configured to radiate a second signal supplied from a wireless communication apparatus of the vehicle to an internal of a resonance cavity formed by the plurality of via holes through a radiation member.

2. The antenna apparatus according to claim 1, wherein the slot is formed in a center area of the first conductive plate, and the plurality of via holes are formed in a center area of the dielectric member.

3. The antenna apparatus according to claim 1, wherein the plurality of via holes are disposed in a shape of a rectangle, and the resonance cavity formed by the plurality of via holes has a shape of a rectangular parallelepiped.

4. The antenna apparatus according to claim 1, wherein the slot is formed in an inside of a predetermined area defined by the plurality of via holes on the first conductive plate.

5. The antenna apparatus according to claim 1, wherein the first feed member is disposed outside the resonance cavity formed by the plurality of via holes.

6. The antenna apparatus according to claim 1, wherein the second feed member is disposed in the inside of the resonance cavity formed by the plurality of via holes.

7. The antenna apparatus according to claim 1, wherein the slot intersects the radiation member.

8. The antenna apparatus according to claim 1, wherein the first signal is radiated to free space through the first conductive plate and the second conductive plate, and the second signal is radiated to the free space through the resonance cavity and the slot.

9. The antenna apparatus according to claim 1,
wherein the first feed member includes a first feed cable having a first internal conductor penetrating the dielectric member to be connected to the first conductive plate, and a first external conductor connected to the second conductive plate, and
wherein the second feed member includes a second feed cable having a first internal conductor penetrating the dielectric member to be connected to the radiation member disposed in the resonance cavity of the dielectric member, and a second external conductor connected to the second conductive plate.

10. A vehicle comprising:
a global positioning system (GPS) receiver;
a wireless communication apparatus; and
an antenna apparatus,
wherein the antenna apparatus comprises:
a first conductive plate in which a slot is formed;
a second conductive plate disposed in parallel to the first conductive plate;
a dielectric member located between the first conductive plate and the second conductive plate;
a plurality of via holes penetrating the first and second conductive plates and the dielectric member;
a first feed member configured to transmit a first signal received through the first and the second conductive plates to the GPS receiver; and
a second feed member configured to radiate a second signal supplied from the wireless communication apparatus to an inside of a resonance cavity formed by the plurality of via holes.

11. The vehicle according to claim 10, wherein the slot is formed in a center area of the first conductive plate, and the plurality of via holes are formed in a center area of the dielectric member.

12. The vehicle according to claim 10, wherein the plurality of via holes are disposed in a shape of a rectangle, and the resonance cavity formed by the plurality of via holes has a shape of a rectangular parallelepiped.

13. The vehicle according to claim 10, wherein the slot is formed in an inside of a predetermined area defined by the plurality of via holes on the first conductive plate.

14. The vehicle according to claim 10, wherein the first feed member is disposed outside the resonance cavity formed by the plurality of via holes.

15. The vehicle according to claim 10, wherein the second feed member is disposed in the inside of the resonance cavity formed by the plurality of via holes.

16. The vehicle according to claim 10, wherein the slot intersects a radiation member.

17. The vehicle according to claim 10, wherein the first signal is received form free space through the first conductive plate and the second conductive plate, and the second signal is radiated to the free space through the resonance cavity and the slot.

18. The vehicle according to claim 10, wherein the GPS receiver is connected to a first antenna of the antenna apparatus, and the first antenna includes the first conductive plate, the second conductive plate, the dielectric member, and the first feed member.

19. The vehicle according to claim 18, wherein the wireless communication apparatus is connected to a second antenna of the antenna apparatus, and the second antenna includes the resonance cavity formed by the plurality of via holes, the slot formed in the first conductive plate, and the second feed member.

20. The vehicle according to claim 10,
wherein the first feed member includes a first feed cable having a first internal conductor penetrating the dielectric member to be connected to the first conductive plate, and a first external conductor connected to the second conductive plate, and
wherein the second feed member includes a second feed cable having a first internal conductor penetrating the dielectric member to be connected to a radiation member disposed in the resonance cavity of the dielectric member, and a second external conductor connected to the second conductive plate.

* * * * *